(12) United States Patent
Ross

(10) Patent No.: US 8,969,738 B2
(45) Date of Patent: Mar. 3, 2015

(54) PORT FOR INHIBITING ELECTROMAGNETIC RADIATION

(75) Inventor: Peter Ross, Middlesex (GB)

(73) Assignee: CP Cases Ltd, Middlesex (GB)

( * ) Notice: Subject to any disclaimer, the term of this patent is extended or adjusted under 35 U.S.C. 154(b) by 96 days.

(21) Appl. No.: 13/989,298

(22) PCT Filed: Nov. 23, 2011

(86) PCT No.: PCT/GB2011/052301
§ 371 (c)(1),
(2), (4) Date: Jul. 23, 2013

(87) PCT Pub. No.: WO2012/069829
PCT Pub. Date: May 31, 2012

(65) Prior Publication Data
US 2013/0299228 A1    Nov. 14, 2013

(30) Foreign Application Priority Data

Nov. 23, 2010 (GB) .................................. 1019816.6

(51) Int. Cl.
*H01R 13/648* (2006.01)
*H05K 9/00* (2006.01)
*G06F 1/18* (2006.01)

(52) U.S. Cl.
CPC .............. *H05K 9/0015* (2013.01); *G06F 1/182* (2013.01); *H05K 9/0018* (2013.01)
USPC ......... 174/359; 174/362; 174/385; 361/679.4

(58) Field of Classification Search
USPC ............... 174/359, 362, 385, 59, 60; 439/98; 361/679.4
See application file for complete search history.

(56) References Cited

U.S. PATENT DOCUMENTS

| | | | |
|---|---|---|---|
| 3,830,954 A | | 8/1974 | Caudill |
| 4,308,417 A | * | 12/1981 | Martin .......................... 174/374 |
| 4,625,072 A | * | 11/1986 | VanBrunt ...................... 174/362 |
| 4,785,136 A | | 11/1988 | Mollet et al. |
| 5,012,042 A | * | 4/1991 | Summach ...................... 174/362 |
| 5,064,388 A | * | 11/1991 | Paladel ..................... 439/607.23 |
| 5,170,008 A | * | 12/1992 | Evans et al. ................... 174/362 |
| 5,855,818 A | | 1/1999 | Gan et al. |
| 6,162,989 A | | 12/2000 | Garner |
| 6,320,122 B1 | * | 11/2001 | Dickey et al. ................. 174/359 |
| 6,469,244 B1 | | 10/2002 | Harrison et al. |

(Continued)

FOREIGN PATENT DOCUMENTS

| | | |
|---|---|---|
| DE | 4421588 A1 | 2/1996 |
| DE | 29620388 U1 | 4/1997 |

(Continued)

OTHER PUBLICATIONS

CP Cases Ltd, PCT International Application No. PCT/GB2011/052301, International Search Report, Feb. 27, 2012.

(Continued)

*Primary Examiner* — Hung V Ngo
(74) *Attorney, Agent, or Firm* — Michael G. Johnston; Moore & Van Allen PLLC

(57) ABSTRACT

A port for inhibiting electromagnetic radiation, the port being arranged to seal an opening and to allow for the passage of one or more electrical cables through the opening, wherein the port comprises at least one slit arranged to engage the one or more cables.

17 Claims, 6 Drawing Sheets

(56) References Cited

U.S. PATENT DOCUMENTS

| | | | |
|---|---|---|---|
| 6,595,789 B2 * | 7/2003 | Oota et al. ................. | 439/98 |
| 6,613,977 B1 | 9/2003 | Fowler | |
| 6,713,674 B2 * | 3/2004 | Chang ...................... | 174/50 |
| 7,139,462 B1 | 11/2006 | Richtman | |
| 2003/0024717 A1 * | 2/2003 | Knighten et al. .......... | 174/35 R |
| 2003/0024718 A1 * | 2/2003 | Rubenstein et al. ....... | 174/35 R |
| 2004/0118582 A1 * | 6/2004 | Deguchi .................. | 174/35 GC |
| 2005/0265003 A1 * | 12/2005 | Coglitore et al. .......... | 361/724 |
| 2008/0080159 A1 | 4/2008 | Sun | |

FOREIGN PATENT DOCUMENTS

| | | |
|---|---|---|
| EP | 0991309 A1 | 4/2000 |
| JP | 01-256198 | 10/1989 |
| JP | 2004128248 A | 4/2004 |
| JP | 2010199306 A | 9/2010 |

OTHER PUBLICATIONS

CP Cases Ltd, British Application No. GB1019816.6, Search Report under Section 17, Mar. 10, 2011.

* cited by examiner

PORT FOR INHIBITING ELECTROMAGNETIC RADIATION

The present disclosure relates to a port. More particularly, it relates to a port that is suitable for inhibiting/screening electromagnetic radiation and emission.

Electromagnetic compatibility (EMC) concerns the application of principles to avoid unintentional generation, propagation and reception of electromagnetic energy and the unwanted effects (Electromagnetic interference, or EMI) that such energy may induce. By the application of EMC, different equipment which generate electromagnetic phenomena may be used in the same electromagnetic environment whilst avoiding any interference effects.

There are two prime issues with EMC: emission and susceptibility/immunity. Emission relates to the unwanted generation of electromagnetic energy by a source, including countermeasures which should be taken in order to reduce such generation and to avoid the escape of energy into the external environment. Susceptibility/immunity issues, in contrast, refer to the sensitivity of electrical equipment to the presence of electromagnetic disturbances.

In any area that is provided with a large amount of electrical equipment, particularly equipment connected to one or more communication networks, EMC must be considered. An example is on modern warships, which are provided with numerous interconnected systems (e.g. communications, detection and imaging systems) and which include a great number of surfaces that may act to reflect radiated energy. In such environments, different pieces of electrical equipment may be provided in closed cases or cabinets (enclosures), which enclosures inhibit electrical radiation. The enclosures prevent the undesirable transfer of electromagnetic energy to, and the ingress of electromagnetic energy from, the external environment. A weak point exists, however, when interconnecting cables must breach the boundary of the enclosure. The entry point of the cabling, as an opening, must be provided with means to inhibit (prevent or significantly reduce) the passage of electromagnetic energy both out of the case (from the equipment within the housing) and into the case (from external equipment).

A prior solution has been the use of expensive EMI shielded cable glands. However, a gland must be provided per cable, where it is common for there to be 96 or more cables entering a small enclosure. Disadvantages include increased cabinet cost, crowding, problems with cable organization and maintenance issues, coupled with a lack of flexibility vis a vis cabling additions/modifications.

The present invention arose in a bid to provide an improved solution to the problem of electromagnetically shielding cable entry points.

According to the present invention in a first aspect, there is provided a port for inhibiting electromagnetic radiation, the port being arranged to seal an opening and to allow for the passage of one or more electrical cables through the opening, wherein the port comprises at least one slit arranged to engage the one or more cables, wherein the or each slit is provided in a sealing member, which comprises a resilient conductive material arranged to seal the opening.

Further, preferred features, are introduced in the dependent claims.

According to the present invention in a further aspect, there is provided an enclosure for housing electrical equipment comprising at least one opening sealed with a port as defined herein.

Embodiments of the invention will now be described, by way of example only, with reference to the accompanying drawings, in which.

Figure 1:
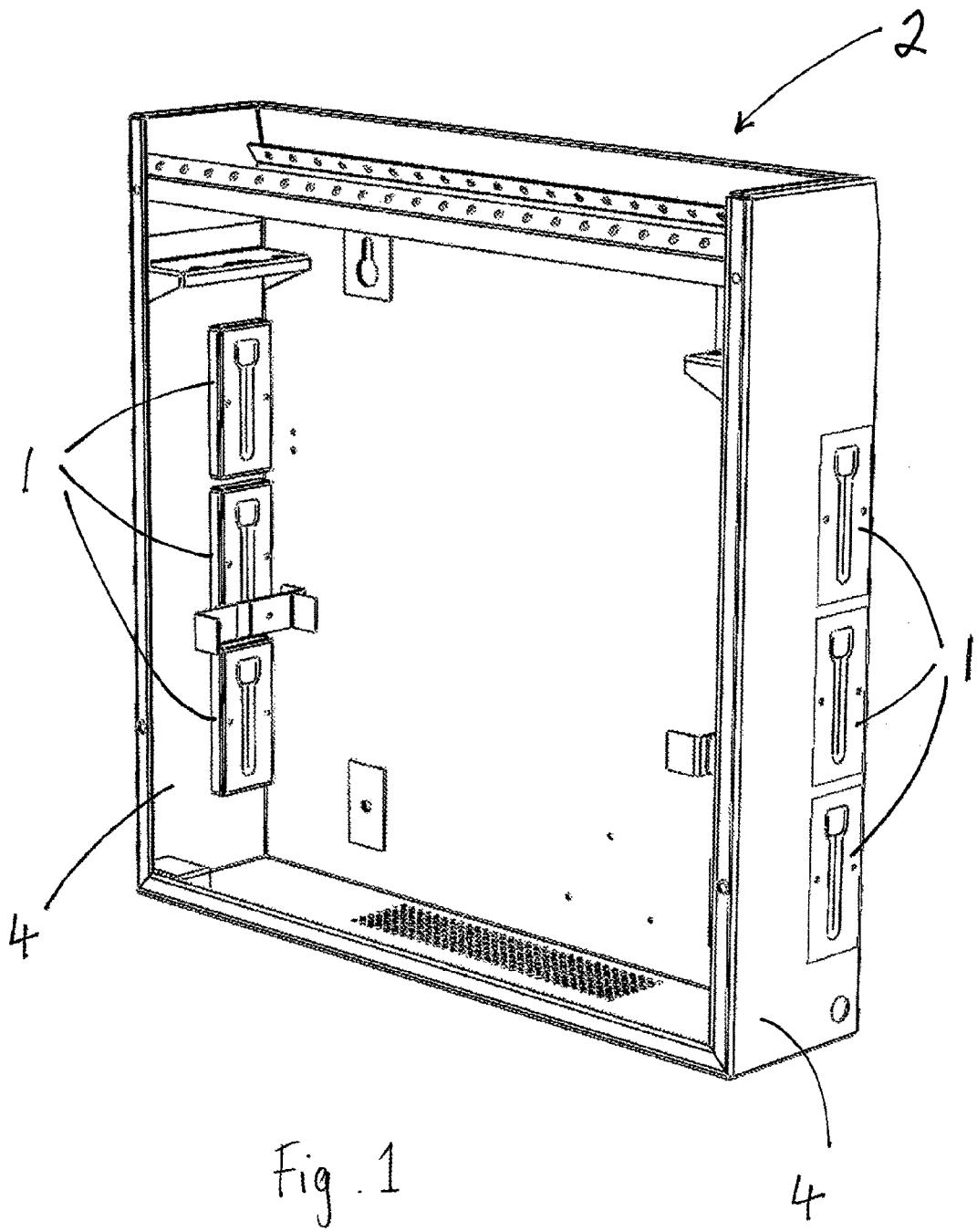
FIG. 1 shows a perspective view of an electrical enclosure (with its lid removed) that is provided with 6 ports according to the present invention.

Referring to FIG. 1, there is shown an enclosure for housing electrical equipment (such as but not limited to communications equipment). The enclosure 2 is of generally standard construction and is shown with its lid removed.

Figure 2:
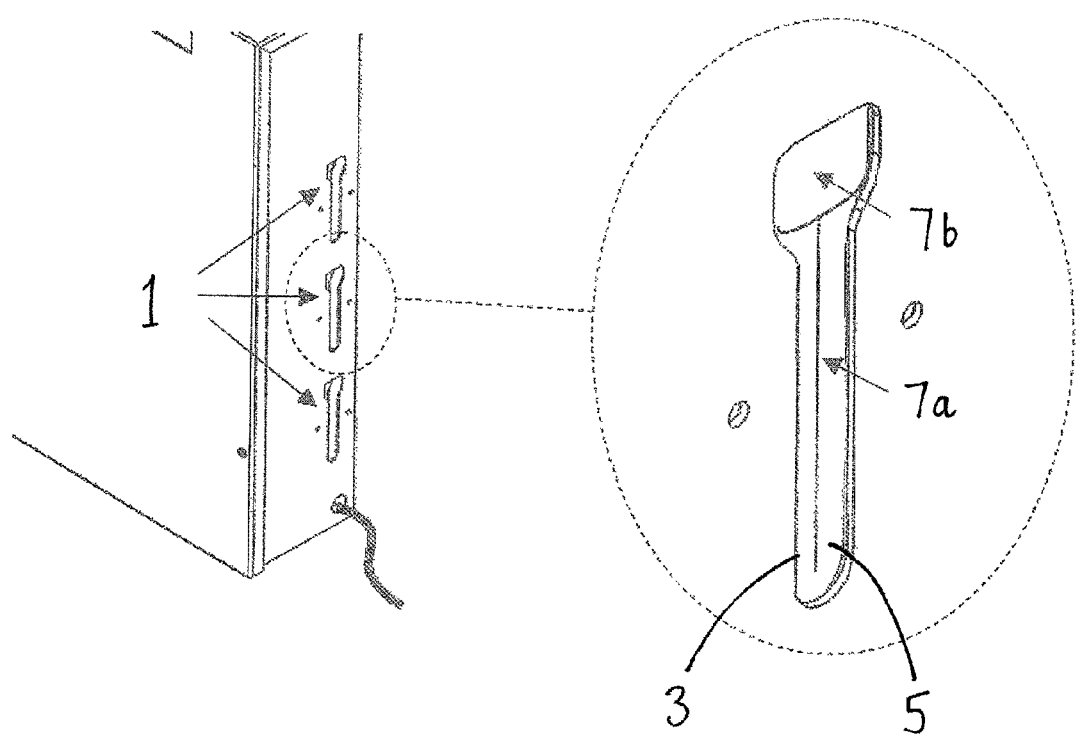
FIG. 2 shows a partial perspective view of the electrical enclosure of FIG. 1 with a detailed exterior view of one of the ports.

The enclosure 2 is shown with six ports 1. Three on either side of the case. Each of these ports comprises an opening 3 (see FIG. 2) in a wall 4 of the case, which is provided to allow for the passage of at least one cable (not shown) through the wall of the case.

As will be readily appreciated, there may be more or less ports provided and the structure of the enclosure is not limited to that depicted.

Figure 3:
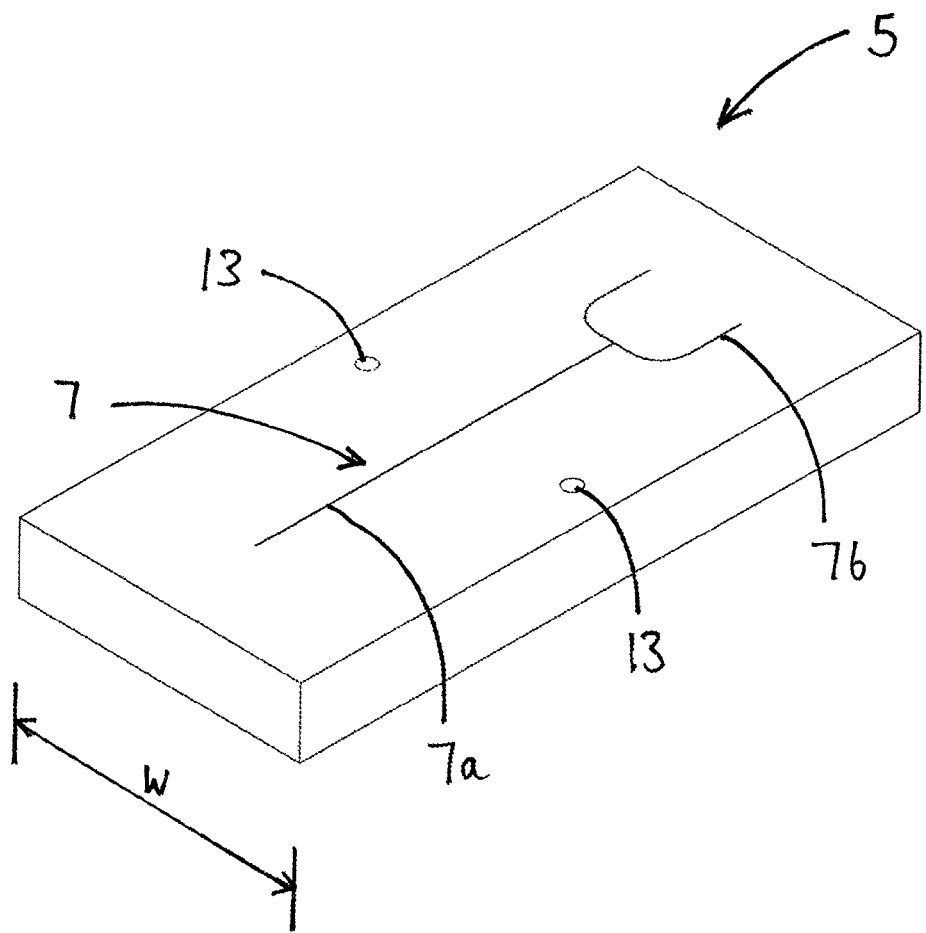
FIG. 3 shows a perspective view of a sealing member from a port.
Figure 4:
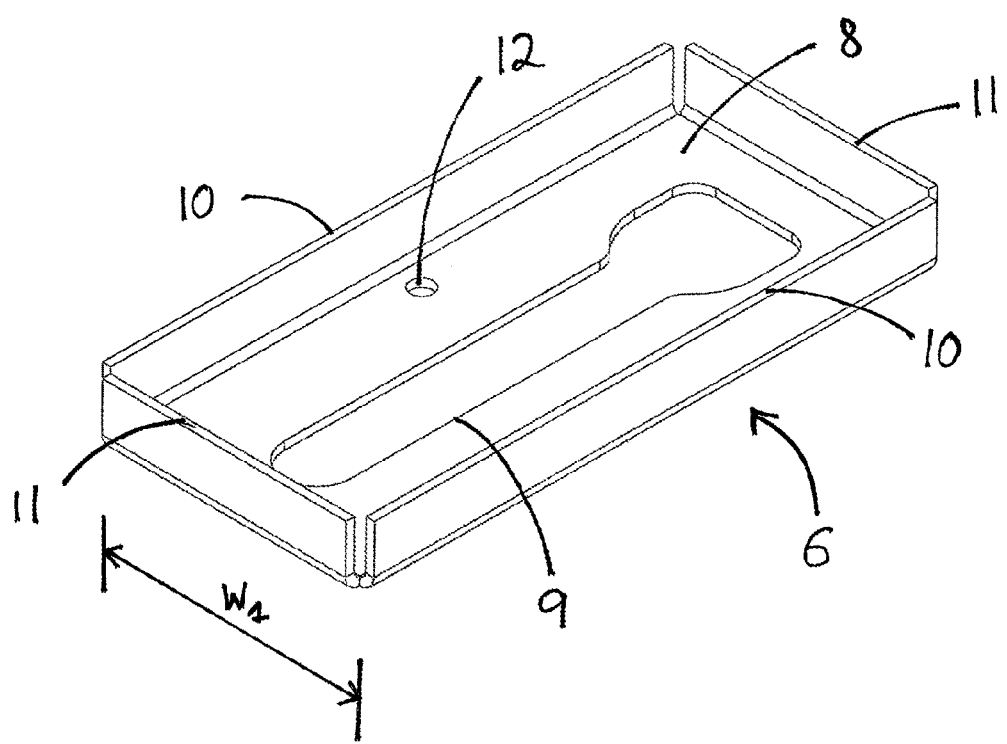
FIG. 4 shows a perspective view of a housing from a port.

Considering the ports in detail, each port comprises an opening 3, a sealing member 5 (see, in particular, FIG. 3) and a housing 6 (see FIG. 4). The sealing member 5 is provided to seal the opening 3. The housing 6 is provided to hold the sealing member in sealing engagement with the wall 4 of the case 2 over the opening 3.

The sealing member 5 comprises a resilient material. The sealing member is preferably of unitary (i.e. single-piece) construction, formed from a single piece of material, as shown. In the present embodiment the sealing member comprises foam. The resilient material/foam is preferably conductive. An example suitable conductive foam is Evazote® EV45CN, which is an ethylene vinyl acetate conductive foam having a density of 45 kg/m$^3$. The foam may have a thickness of 10 mm.

Figure 5A:
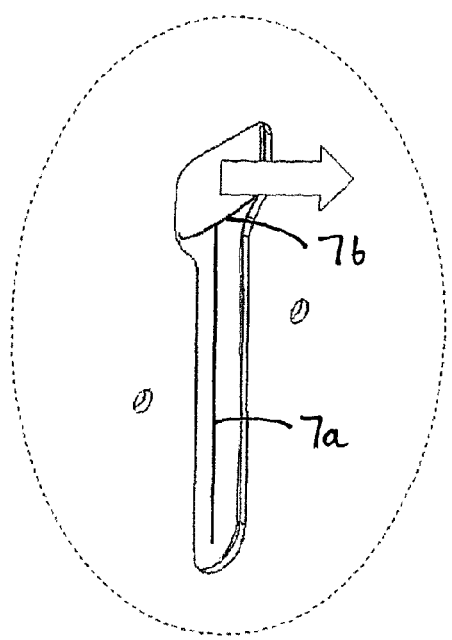
FIGS. 5a to 5d show the insertion of a cable into the port.
Figure 5B:
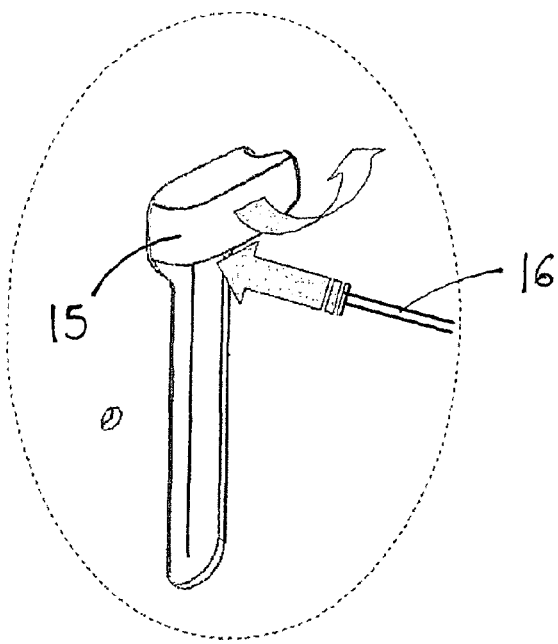

The sealing member 5 is provided with a slit 7, which extends through the thickness of the foam. The slit has a negligible width. The slit may be a knife slit, formed by cutting the foam with a knife. The slit is most preferably closed at both ends, as shown, which maintains the sealing member as a unitary element. The slit comprises a longitudinally extending portion 7a and an end portion 7b. The longitudinally extending portion is preferably of sufficient length to seal around the circumferences of a plurality of cables. The longitudinally extending portion 7a and end portion 7b are continuous. The end portion is substantially U-shaped although may take any other suitable forms, for example, it could be C-shaped by rotation through 90°, or could be formed otherwise. The purpose of the end portion is to allow the passage of a connector, which has an enlarged profile relative to the cable and is mounted to the end of the cable, through the sealing member 5 and thus through the opening 3. The cable could, for example, be a network cable provided with an RJ-45 connector on its end or any other power, signal or data cable. The end portion forms a flap that may be opened for passage of the connector (as shown in FIG. 5b) and closed (as shown in FIG. 5a) to maintain a seal.

It should be appreciated that the slit may take various other forms and is not limited to a slit provided with a longitudinally extending portion. This is, however, preferred.

The sealing member 5 is preferably held in a state of compression. The compressive force may be applied by the housing 6. For example, as shown, the sealing member 5 has a width W that is greater than the internal width $W_1$ of the housing 6. As a specific example, the sealing member of the foam may have a width W of 49 mm whilst the housing 6 has an internal width $W_1$ of 47 mm. By virtue of the inherent resilience of the foam it is maintained in a laterally compressed state in the width direction, i.e. transversely of the longitudinal axis of the slit. The sealing member may also be held in a state of compression in the longitudinal direction, wherein the length of the sealing member can be greater than the internal length of the housing 6.

Whilst, the sealing member is shown to be rectangular, it need not be limited as such and could, for example, be round, triangular or other two or three dimensional shapes. A compressive force may be applied to the sealing member from all sides of such shapes.

The housing 6 comprises a base 8 that is provided with a second opening 9 that is arranged to correspond, in use, to the opening 3 in the wall 4 of the case 2 (the two are aligned and preferably identical in form) to thereby allow passage of the cable through the port 1. The base 8 is substantially rectangular and provided with four upstanding walls, two opposed side walls 10 and two opposed end walls 11, which are integrally formed with the base by bending. The inner surfaces of the opposed inner side walls combine to define the internal width $W_1$ of the housing and the inner surfaces of the opposed end walls 11 combine to define the internal length of the housing. A pair of holes 12 are provided as a means to mount the housing to the wall of the housing. Note that corresponding holes 13 are provided through the sealing member 5. The housing may be bolted to the wall of the enclosure over the opening 3. The housing is preferably provided on an inner face of the enclosure wall.

The housing as shown is of unitary construction although need not be. Moreover, the side and end walls need not be formed by bending but could be formed by forming, pressing, moulding or similar. Whilst the housing is shown to be rectangular, it need not be. The shape will depend on the shape of the sealing member. The housing is preferably formed from a conductive material. The bolts are also preferably conductive.

With a conductive enclosure, the sealing member, formed of conductive foam, is grounded with the enclosure, which enhances the shielding effect of the port. That is, there is an electrical continuity between the enclosure to be sealed and the sealing member. When the sealing member maintains electrical continuity with the enclosure EMC connectivity may be ensured.

In order to protect the longevity of the electrical continuity between the enclosure and the sealing member 5, corrosion/oxidation protection of the case materials may be implemented. For example, where the case is steel it may receive a passivation coating. With anti-corrosion/oxidation measures the long term electrical continuity may be ensured to prevent any reduction in EMC shielding performance of the port. A suitable measure for application to steel is, for example, the passivation by etch-priming using HMG PAINTS LTD product "NT2000." Other suitable measures may be adopted for alternative materials, as will be readily appreciated by those skilled in the art.

Figure 5C:
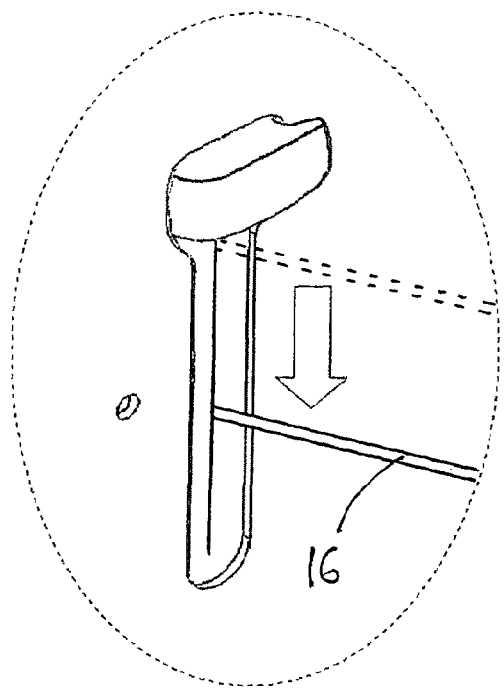
Figure 5D:
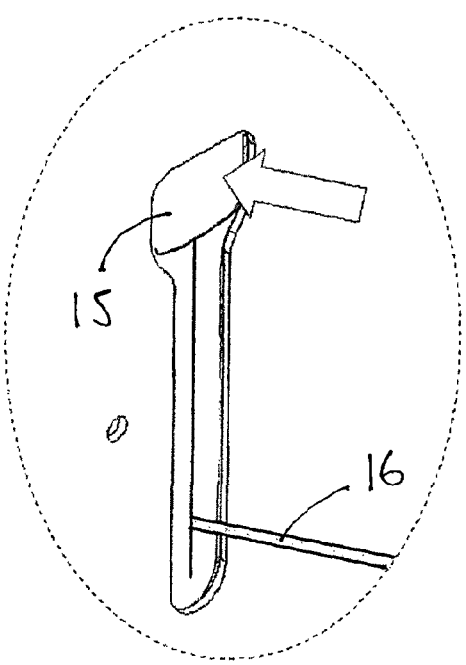

FIGS. 5a to 5d show the use of a port 1. Firstly, as shown in FIG. 5a, the end portion 7b of the slit 7 is pushed out. It should be noted that it may equally be pushed in. The end portion, by virtue of the U-shaped slit, defines a flap 15, as shown in FIG. 5b, which may be considered a sealable opening, through which the head of a cable (not shown) is inserted. Once the head of the cable has been fed through the sealable opening, the cable 16 may be slid down the slit. The cable is slid within the slit laterally of its longitudinal axis, as shown in FIG. 5c. The slit will generally be arranged to receive a number of similar cables which are inserted in turn and arranged in axial alignment in the slit (where the slit is straight). The slit may receive multiple cables by having a length that is greater than combined lengths of the diameters of all of the cables to be received. Once one or all of the cables have been received within the slit, the flap is folded back to seal the sealable opening. It should be appreciated that in alternative arrangements a flap may be provided at both ends of the slit.

The slit is normally closed. By virtue of the resilience of the foam of the sealing member, however, the slit may be urged open with the lateral sliding of the cable(s) therein. However, once in the desired position within the slit, the foam will act to close back around the or each cable for suitable sealing. The slit has the ability to accept cables of various diameters, including cables having non-circular cross-sections. The slit may receive two or more cables having different shapes and/or diameters at once. The compressive force on the foam enhances the sealing ability of the foam.

The port allows simple introduction, removal or replacement of cables. It allows the retro fitment of cables without the removal or disassembly of the port.

The port is preferably arranged to meet IP24, or more preferably IP44, as set out in BS EN 60529, which is the classification of the degree of protection from dust water and impact provided by electrical equipment and enclosures.

Alternative arrangements will be readily conceived by those skilled in the art within the scope of the claims. For example, whilst a single slit only may be provided in the sealing member, as shown, there may be more than one slit provided in each sealing member. There may be two or more slits provided in axial alignment or arranged side by side in parallel. With multiple slits provided, there will be multiple corresponding openings formed in the housing and in the case wall.

The invention claimed is:

1. A port for inhibiting electromagnetic radiation, the port being arranged to seal an opening in a wall and to allow for passage through the opening of one or more electrical cables including connectors at their ends, the port comprising:
    a sealing member of unitary construction, the sealing member comprising a resilient conductive foam material arranged to seal the opening and defining at least one slit arranged to engage the one or more cables, the slit terminating at at least one end in a sealable opening;
    a housing within which the sealing member is mounted, the housing being arranged to urge the sealing member against the wall defining the opening to be sealed; and
    a flap arranged for allowing passage of one or more connectors through the sealable opening.

2. A port as claimed in claim 1, wherein the slit is arranged to seal around the circumference of the or each cable.

3. A port as claimed in claim 1, wherein the slit is arranged such that it may receive a plurality of cables at once.

4. A port as claimed in claim 1, wherein the slit is closed at both ends.

5. A port as claimed in claim 1, wherein the flap is formed by a further slit that is continuous with the slit.

6. A port as claimed in claim 5, wherein the further slit is C-shaped, U-shaped or V-shaped.

7. A port as claimed in claim 1, wherein the resilient material is maintained in a state of compression.

8. A port as claimed in claim 7, wherein the or each slit is longitudinally extending and a transverse compressive force is applied to the resilient material, relative to a longitudinal axis of the slit.

9. A port as claimed in claim 1, wherein the sealing member has an unstressed dimension that is greater than a corresponding inner dimension of the housing.

10. A port as claimed in claim 1, wherein the housing is of unitary construction.

11. A port as claimed in claim 1, wherein the slit is arranged such that it is ordinarily closed.

12. A port as claimed in claim 1, wherein the sealing member is arranged to deform around the or each cable.

13. A port as claimed in claim 1, wherein the seal formed is such that the port conforms to at least IP24.

14. A port as claimed in claim 1, wherein the seal formed is such that the port conforms to at least IP44.

15. A port as claimed in claim 1 that is arranged to allow retro-fitment of new cables without resort to port removal or disassembly.

16. An enclosure for housing electrical equipment comprising at least one opening sealed with a port as defined in claim 1.

17. An enclosure as claimed in claim 16, wherein the sealing member is electrically grounded with the enclosure.

* * * * *